(12) United States Patent
Nagano et al.

(10) Patent No.: US 6,239,680 B1
(45) Date of Patent: May 29, 2001

(54) MAGNETIC FIELD STABILIZATION METHOD, MAGNETIC FIELD GENERATING APPARATUS AND MAGNETIC RESONANCE IMAGING APPARATUS

(75) Inventors: Shigeo Nagano; Tsunemoto Suzuki; Hideaki Uno; Yuji Inoue; Yoshifumi Higa; Yoshiaki Tsujii, all of Tokyo (JP)

(73) Assignee: GE Yokogawa Medical Systems, Limited, Tokyo (JP)

( * ) Notice: Subject to any disclaimer, the term of this patent is extended or adjusted under 35 U.S.C. 154(b) by 0 days.

(21) Appl. No.: 09/506,868

(22) Filed: Feb. 9, 2000

(30) Foreign Application Priority Data

Apr. 7, 1999 (JP) .................................... 11-099776

(51) Int. Cl.[7] .............. G01V 3/00; H01F 1/00; H01F 41/00; H01F 7/00
(52) U.S. Cl. .............. 335/296; 335/217; 335/300; 324/318; 324/319
(58) Field of Search .................... 335/216, 217, 335/296–306; 324/318, 319, 320

(56) References Cited

U.S. PATENT DOCUMENTS

| | | | |
|---|---|---|---|
| 3,810,254 | * | 5/1974 | Utsumi et al. ................. 335/301 |
| 5,652,517 | | 7/1997 | Maki et al. .................... 324/318 |

* cited by examiner

*Primary Examiner*—Ray Barrera
(74) *Attorney, Agent, or Firm*—Moonray Kojima

(57) ABSTRACT

In order to provide a magnetic field stabilization method, magnetic field generating apparatus and magnetic resonance imaging apparatus that is not affected by the temperature distribution in an installation space, in stabilizing a magnetic field of a magnetic field generating apparatus 2 having a pair of permanent magnets facing each other with a space interposed and yokes constituting a magnetic circuit for the permanent magnets, heat quantities to be applied to a plurality of positions are individually controlled (172, 174) based on the temperatures detected at a plurality of positions 154, 158 on the yoke to stabilize the respective temperatures at the plurality of positions.

8 Claims, 7 Drawing Sheets

| Heat element | Heat release pattern | | | | | | | |
|---|---|---|---|---|---|---|---|---|
| | 1 | 2 | 3 | 4 | 5 | 6 | 7 | 8 |
| A 120W | ON | ON | OFF | PWM | PWM | ON | OFF | PWM |
| B 30W | ON | OFF | ON | ON | OFF | PWM | PWM | PWM |

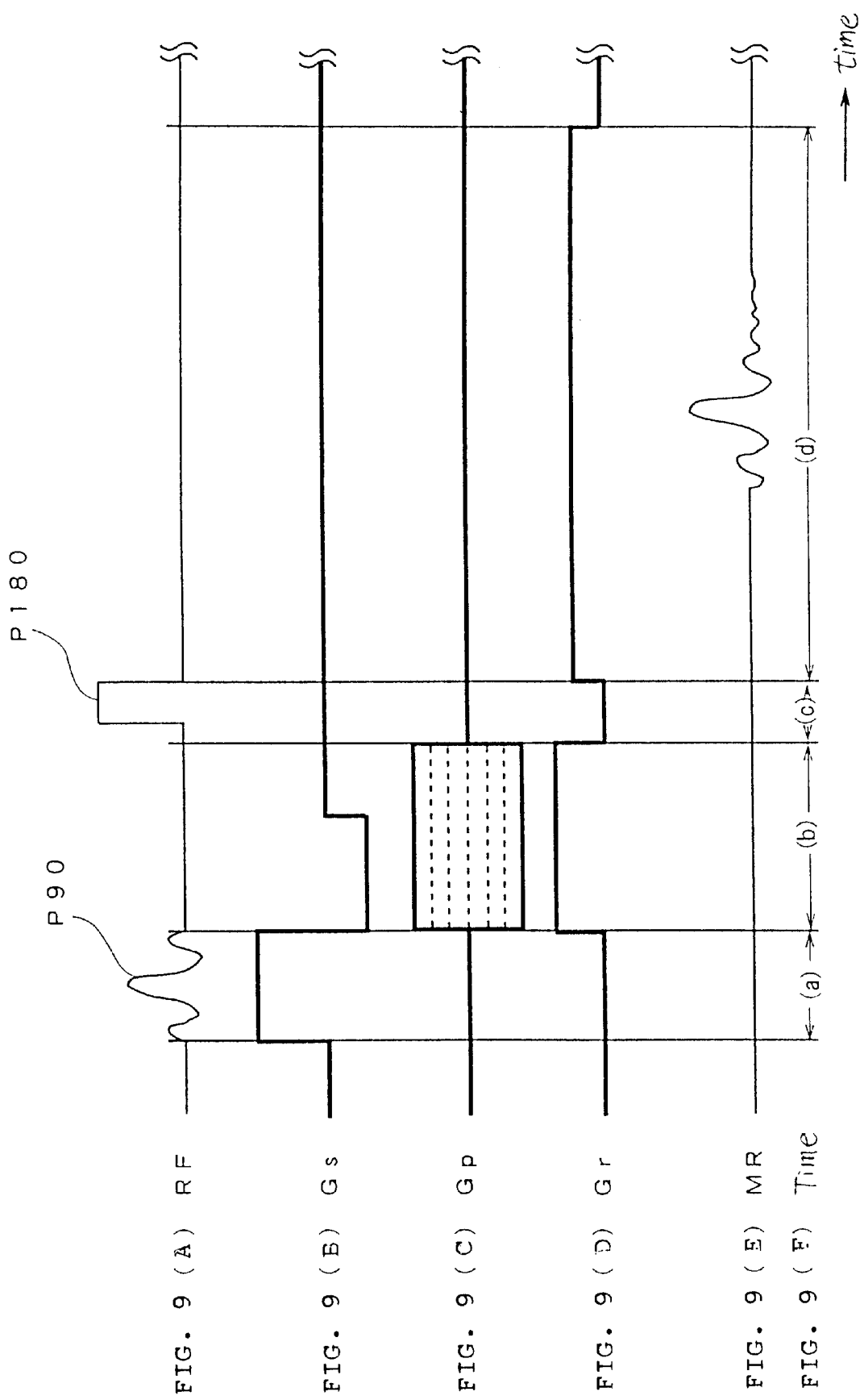

MAGNETIC FIELD STABILIZATION METHOD, MAGNETIC FIELD GENERATING APPARATUS AND MAGNETIC RESONANCE IMAGING APPARATUS

BACKGROUND OF THE INVENTION

The present invention relates to a magnetic field stabilization method, magnetic field generating apparatus and magnetic resonance imaging apparatus, and more particularly to a method of stabilizing a magnetic field of a magnetic field generating apparatus employing permanent magnets, a magnetic field generating apparatus that generates a stable magnetic field, and a magnetic resonance imaging apparatus that employs such a magnetic field generating apparatus.

A magnetic field generating apparatus that employs permanent magnets for magnetic resonance imaging has a pair of permanent magnets facing each other in the vertical direction with a space interposed, and yokes constituting a magnetic circuit for the permanent magnets. In order to generate a stable magnetic field while preventing a change in magnetic field strength due to a variation in the ambient temperature, the magnetic field generating apparatus is kept at a constant temperature. The constant temperature is selected so that it is slightly higher than the ordinary temperature, and yet the permanent magnet does not lose its magnetism. For example, a temperature of 30° C. is selected.

The temperature is maintained by using an electric heater as a heat supply source, and the heat release amount of the electric heater is controlled by a controller. The controller is supplied with a detected signal indicative of the temperature measured at a predetermined position in the magnetic field generating apparatus. The temperature measurement point to obtain the detected signal is positioned within a yoke immediately above an upper permanent magnet, for example. The controller controls the heat release amount of the electric heater so that a value of the detected signal is equalized to a predetermined value.

The electric heater employed is one having a large heat release amount corresponding to a large heat capacity of the magnetic field generating apparatus, and the controller on-off controls the electric heater with PWM (pulse-width-modulation) signals. The duty ratio between ON and OFF is PID-controlled (proportional-plus-integral-plus-derivative-controlled) according to the deviation of the detected signals from the predetermined value.

In attempting to maintain the constant temperature of the magnetic field generating apparatus by the temperature control as described above, a difference arises between the temperatures of the upper and lower permanent magnets when a temperature difference is increased between upper and lower positions in a space in which the magnetic field generating apparatus is installed, as is often the case with a mobile magnetic resonance imaging apparatus in the hard winter, etc., leading to a problem that the stability of the magnetic field is deteriorated.

Moreover, since an electric heater having a large heat release amount is employed, frequency of switching between ON and OFF is increased when the temperature control is conducted with a small temperature deviation, i.e., in the low-ripple state, causing the control to be prone to instability due to a lag of heat conduction within the magnetic field generating apparatus. Furthermore, the increase in frequency of switching between ON and OFF gives rise to noises, which deteriorates the quality of captured images.

SUMMARY OF THE INVENTION

It is therefore an object of the present invention to provide a magnetic field stabilization method, magnetic field generating apparatus and magnetic resonance imaging apparatus that is not affected by the temperature distribution in an installation space.

It is another object of the present invention to provide a magnetic field stabilization method, magnetic field generating apparatus and magnetic resonance imaging apparatus whose control system has good stability.

In accordance with a first aspect of the present invention, there is provided a magnetic field stabilization method of stabilizing a magnetic field of a magnetic field generating apparatus having a pair of permanent magnets facing each other with a space interposed and yokes constituting a magnetic circuit for the permanent magnets, comprising the steps of: detecting temperatures of a plurality of positions in the yokes; and controlling respective heat quantities to be applied to the plurality of positions based on the detected temperatures of the plurality of positions to stabilize the respective temperatures of the plurality of positions.

In accordance with a second aspect of the present invention, there is provided a magnetic field stabilization method for a magnetic field generating apparatus having a pair of permanent magnets facing each other with a space interposed and yokes constituting a magnetic circuit for the permanent magnets, comprising the steps of: detecting a temperature of the yoke; and controlling a heat quantity to be applied to the yoke based on the detected temperature to stabilize a magnetic field, wherein the heat quantity to be applied to the yoke is obtained by a combination of heat quantities generated by a plurality of heat generating sources.

In accordance with a third aspect of the present invention, there is provided a magnetic field generating apparatus comprising: a pair of permanent magnets facing each other with a space interposed; yokes constituting a magnetic circuit for the permanent magnets; a plurality of temperature detecting means for detecting temperatures of a plurality of positions in the yokes; a plurality of heat generating means for generating respective heat quantities to be applied to the plurality of positions; and a plurality of temperature regulating means for controlling the plurality of heat generating means, respectively, based on the detected temperatures of the plurality of positions to stabilize the respective temperatures of the plurality of positions.

In accordance with a fourth aspect of the present invention, there is provided a magnetic field generating apparatus having: a pair of permanent magnets facing each other with a space interposed; yokes constituting a magnetic circuit for the permanent magnets; temperature detecting means for detecting a temperature of the yoke; heat generating means for generating a heat quantity to be applied to the yoke; and temperature regulating means for controlling the heat generating means based on the detected temperature to stabilize the temperature of the yoke, wherein the heat generating means comprises a plurality of heat generating sources, and the temperature regulating means also controls a combination of heat quantities of the plurality of heat generating sources.

(Effect)

According to the present invention, the entire magnetic field generating apparatus is kept at a constant temperature by detecting temperatures of a plurality of positions in the yokes, and controlling respective heat quantities to be applied to the plurality of positions based on the respective detected temperatures to stabilize the respective temperatures of the plurality of positions. Moreover, the control is stabilized by also controlling a combination of heat quantities of a plurality of heat generating sources for generating the heat quantity to be applied to the yoke.

Therefore, the present invention can provide a magnetic field stabilization method, magnetic field generating apparatus and magnetic resonance imaging apparatus that is not affected by the temperature distribution in an installation space. Moreover, the present invention can provide a magnetic field stabilization method, magnetic field generating apparatus and magnetic resonance imaging apparatus whose control system has good stability.

Further objects and advantages of the present invention will be apparent from the following description of the preferred embodiments of the invention as illustrated in the accompanying drawings.

BRIEF DESCRIPTION OF THE DRAWINGS

FIGS. 9(A)–9(F) schematically shows an exemplary pulse sequence executed by the apparatus shown in FIG. 1.

DETAILED DESCRIPTION OF THE INVENTION

Figure 1:
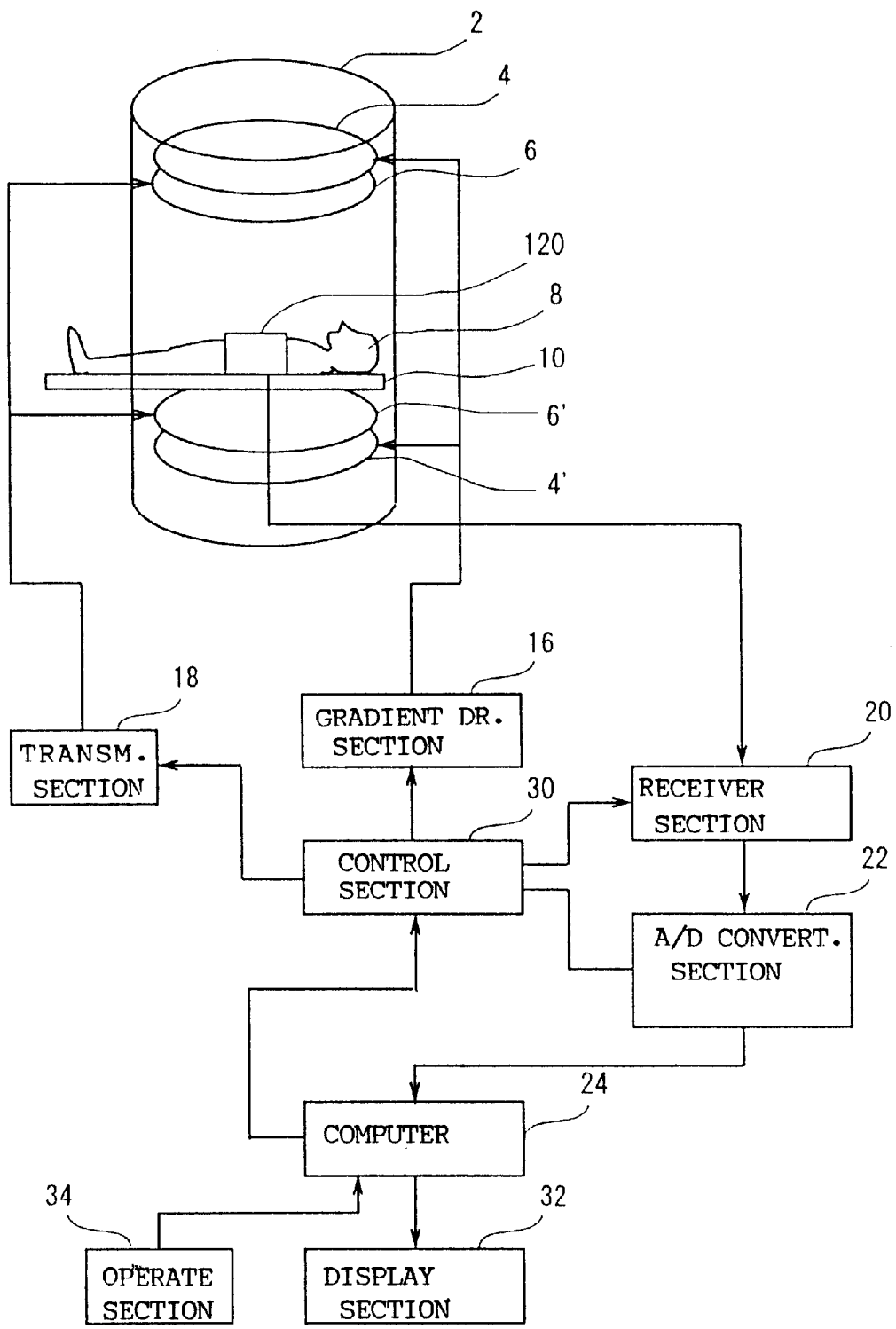
FIG. 1 is a block diagram of an apparatus in accordance with an embodiment of the present invention.

The embodiments of the present invention will now be described in more detail with reference to the accompanying drawings. FIG. 1 shows a block diagram of a magnetic resonance imaging apparatus, which is an embodiment of the present invention. The configuration of the apparatus represents an embodiment of the apparatus in accordance with the present invention.

As shown in FIG. 1, the apparatus comprises a static magnetic field generating section 2 that generates a homogeneous static magnetic field in its internal space. The static magnetic field generating section 2 represents an embodiment of the magnetic field generating apparatus of the present invention. The configuration of the magnetic field generating section 2 represents an embodiment of the apparatus of the present invention, and the operation of the magnetic field generating section 2 represents an embodiment of the method of the present invention. The static magnetic field generating section 2 also represents an embodiment of the static magnetic field generating means of the present invention. The static magnetic field generating section 2 comprises a pair of permanent magnets, which will be described in more detail later, facing each other in the vertical direction maintaining a certain distance and generating a static magnetic field (vertical magnetic field) within the interposed space.

Within the internal space of the static magnetic field generating section 2 are disposed gradient coil sections 4, 4' and transmit coil sections 6, 6' facing each other likewise in the vertical direction maintaining a certain distance. A subject 8 is placed on an imaging table 10 and carried into a space interposed between the opposing transmit coil sections 6 and 6' by carrying means (not shown). The body axis of the subject 8 is orthogonal to the direction of the static magnetic field. The imaging table 10 is fitted with a receive coil section 120 surrounding an imaging site of the subject 8.

The gradient coil sections 4 and 4' are connected with a gradient driving section 16, for supplying drive signals to the gradient coil sections 4 and 4' to generate gradient magnetic fields. The gradient coil sections 4, 4' and the gradient driving section 16 together represent an embodiment of the gradient magnetic field generating means of the present invention. The gradient magnetic fields to be generated are following three: a slice gradient magnetic field, a readout gradient magnetic field and a phase-encoding gradient magnetic field.

The transmit coil sections 6 and 6' are connected with a transmitter section 18, for supplying drive signals to the transmit coil sections 6 and 6' to generate an RF (radio frequency) magnetic field, thereby exciting spins within the subject 8. The transmit coil sections 6, 6' and the transmitter section 18 together represent an embodiment of the high frequency magnetic field generating means of the present invention.

The receive coil section 120 receives magnetic resonance signals generated by the excited spins within the subject 8. The receive coil section 120 is connected to the input of a receiver section 20 that is supplied with the received signals from the receive coil section 120. The output of the receiver section 20 is connected to the input of an analog-to-digital (A-D) converter section 22 for converting output signals of the receiver section 20 into digital signals. The receive coil section 120, the receiver section 20 and the A-D converter section 22 together represent an embodiment of the measuring means of the present invention.

The output of the A-D converter section 22 is connected to a computer 24. The computer 24 receives the digital signals from the A-D converter section 22 and stores them into a memory (not shown). In the memory is formed a data space that constitutes a two-dimensional Fourier space. The computer 24 performs a two-dimensional inverse Fourier transformation on the data in the two-dimensional Fourier space to reconstruct an image of the subject 8. The computer 24 represents an embodiment of the image producing means of the present invention.

The computer 24 is connected to a control section 30, which is in turn connected to the gradient driving section 16, the transmitter section 18, the receiver section 20 and the A-D converter section 22. The control section 30 controls the gradient driving section 16, the transmitter section 18, the receiver section 20 and the A-D converter section 22 based on respective commands supplied from the computer 24 to perform magnetic resonance imaging (i.e., a scan).

The computer 24 is connected with a display section 32 that displays the reconstructed image and several information output from the computer 24, and an operating section 34 that is operated by a human operator inputting several commands and information to the computer 24.

Figure 2:
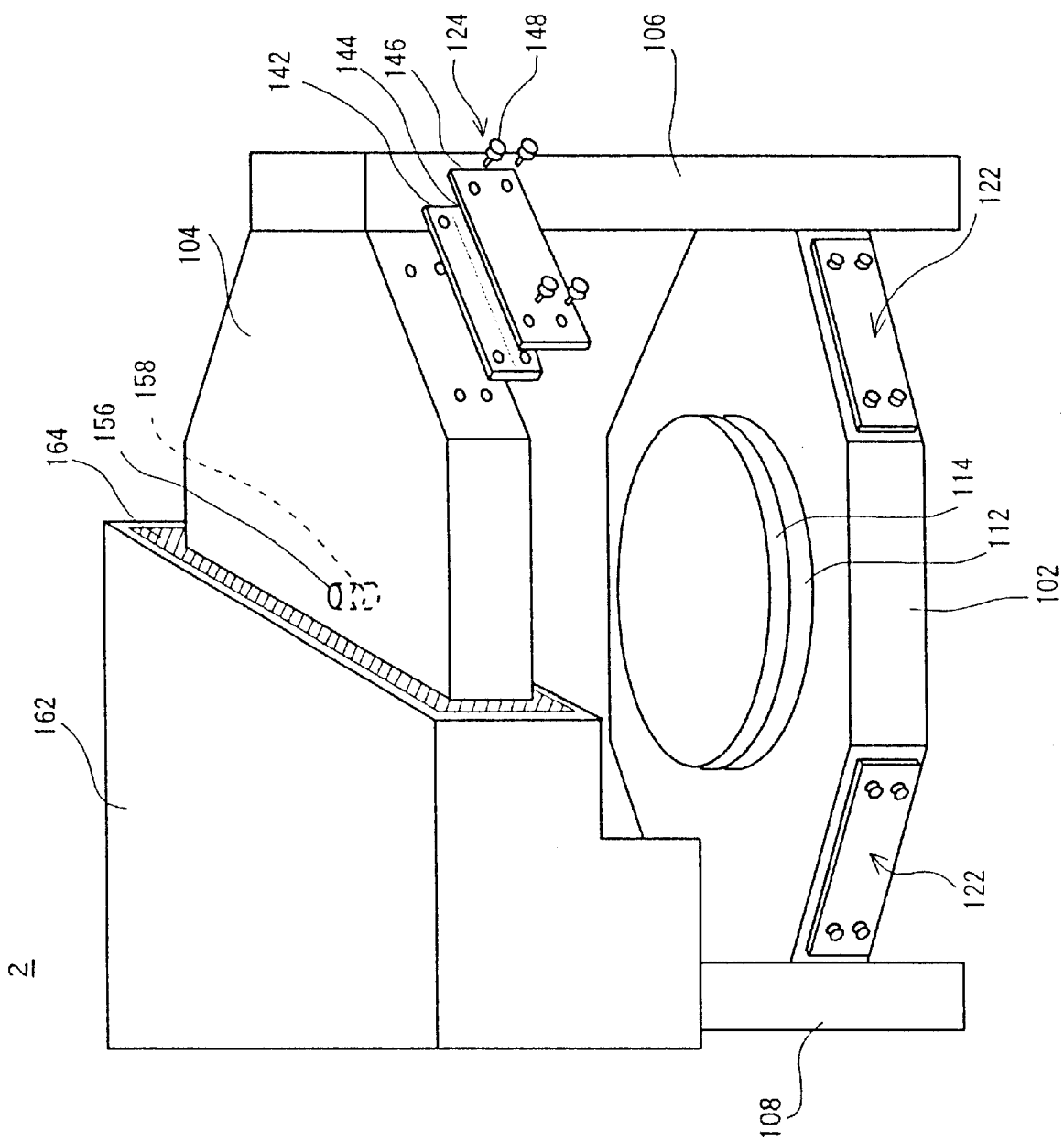
FIG. 2 schematically illustrates configuration of a static magnetic field generating section in the apparatus shown in FIG. 1.

FIG. 2 schematically illustrates an exemplary configuration of the static magnetic field generating section 2. As shown, the static magnetic field generating section 2 has a pair of horizontal yokes 102 and 104, which are generally octagonal flat plates of a magnetic material such as soft iron. The horizontal yokes 102 and 104 are supported in parallel with each other by a pair of vertical yokes 106 and 108 and face each other in the vertical direction (in the drawing) maintaining a certain distance. The vertical yokes 106 and 108 are also made of a magnetic material such as soft iron, and have a prism-like shape. The lower portions (in the drawing) of the vertical yokes 106 and 108 serve as legs for supporting the entire static magnetic field generating section 2.

The horizontal yoke 102 is fitted in the central portion of its upper surface (in the drawing) with a permanent magnet 112, which is in turn fitted on its upper surface (in the drawing) with a pole piece 114. The pole piece 114 is made of a magnetic material such as soft iron.

The horizontal yoke 104 is fitted on its lower surface (in the drawing) with a permanent magnet 116 (which is hidden and not shown in FIG. 2) in a positional relationship such that it faces the permanent magnet 112, and the permanent magnet 116 is fitted on its lower surface with a pole piece 118 (which is also hidden and not shown in FIG. 2). The permanent magnets 112 and 116 represent an embodiment of the permanent magnets of the present invention.

With respect to the permanent magnets 112 and 116, their magnetic poles face each other with opposite polarities facing each other, thereby generating a vertical magnetic field within a space interposed between the opposite pole pieces 114 and 118. The horizontal yokes 102, 104 and the vertical yokes 106, 108 establish a return path for a magnetic flux of the permanent magnets 112 and 116. A portion consisting of the horizontal yokes 102,104 and the vertical yokes 106, 108 represents an embodiment of the yokes of the present invention.

The horizontal yoke 102 is fitted on its lateral surface with electric heaters 122. The electric heaters 122 are attached on four positions on the lateral surface of the horizontal yoke 102 at generally regular intervals along its periphery. Two of the electric heaters 122 can be seen in FIG. 2 and the rest are hidden and not shown. Likewise, the horizontal yoke 104 is fitted with four electric heaters 124, only one of which is shown as an exploded view in FIG. 2. The electric heaters 122 and 124 represent an embodiment of the heat generating means of the present invention.

The electric heater 124 has two heat elements 142 and 144 comprised of electric resistors. The heat elements 142 and 144 represent an embodiment of the heat generating source of the present invention. The heat elements 142 and 144 have different heat release amounts, and for example, the heat element 142 has a heat release amount of 120 W and the heat element 144 has a heat release amount of 30 W. However, the heat elements 142 and 144 may have an identical heat release amount. Moreover, the number of the heat elements is not limited to two but may be more than two. While the following description will be made with reference to a case in which the number of the heat elements is two, the same applies to a case in which the number of the heat elements is more than two.

The heat elements 142 and 144 are secured to the lateral surface of the horizontal yoke 104 using a hold plate 146 screwed by four screws 138. The heat elements 142 and 144 are electrically insulated from the horizontal yoke 104, hold plate 146 and screws 148. The electric heater 122 has similar configuration, and has two heat elements 132 and 134 (not shown in FIG. 2). These two electric heaters 122 and 124 are connected to a temperature control circuit, which will be described later.

The horizontal yoke 104 is provided in the central portion on its upper surface with a closed-end hole 156, into which a temperature sensor 158 comprised of a thermistor, for example, is inserted. Although hidden and not shown in FIG. 2, the horizontal yoke 102 is also provided in the central portion on its lower surface with a closed-end hole 152, into which a temperature sensor 154 is inserted. The temperature sensors 154 and 158 represent an embodiment of the temperature detecting means of the present invention. The temperature sensor 154 and 158 are connected to the temperature control circuit, which will be described later.

The above-described structure is contained in a cover 162. The cover 162 has a configuration such that a space portion interposed between the opposite pole pieces 114 and 118 is opened, although the cover 162 is shown as being largely removed in FIG. 2. Inside the cover 162, a heat insulating material 164 of polyurethane foam, for example, is provided. The static magnetic field generating section 2 thus configured is shown as a cross-sectional view in FIG. 3, in which a vertical cross section including the centers of the horizontal yokes 102, 104 and the vertical yokes 106, 108 is shown.

Figure 4:
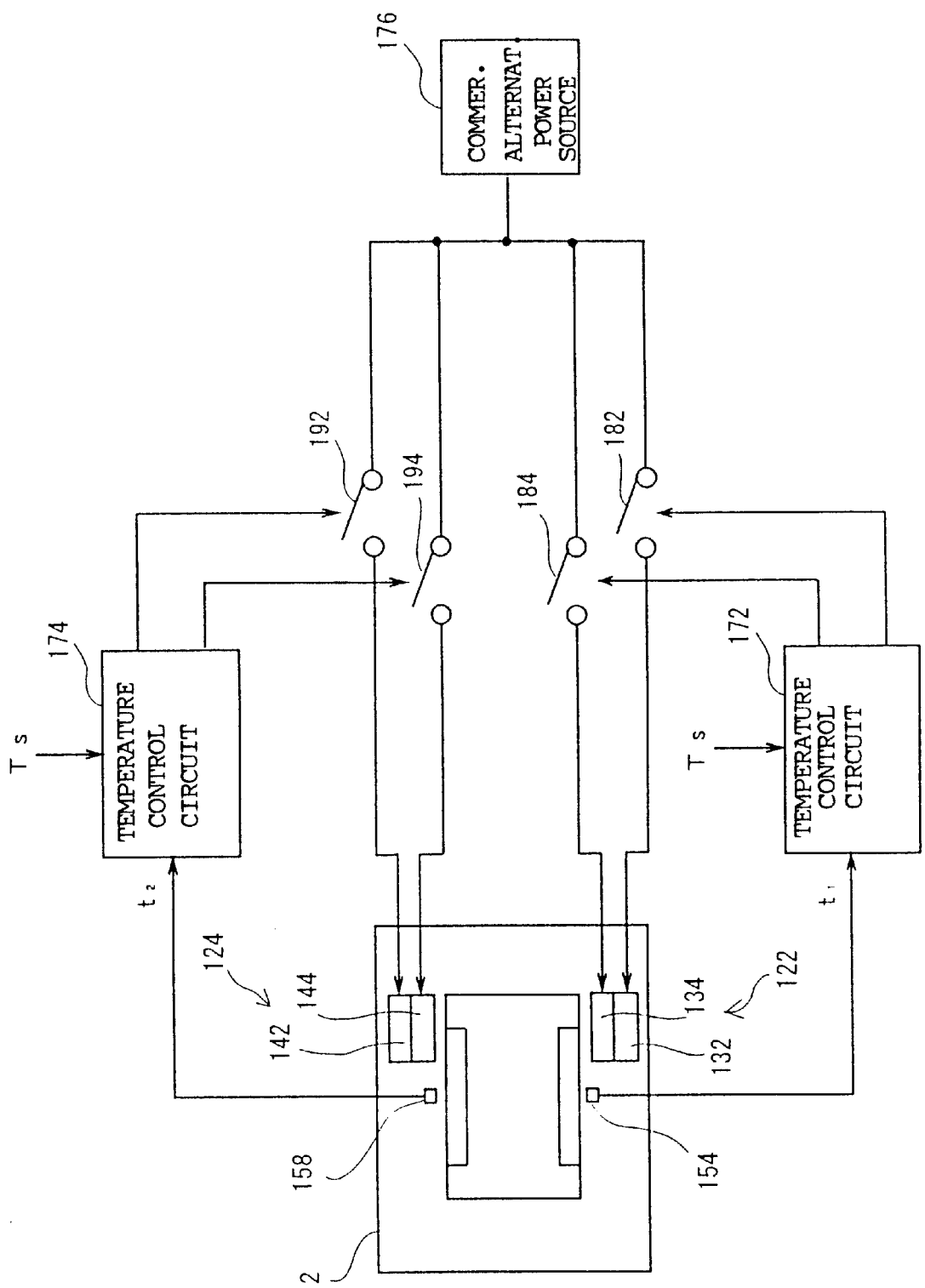
FIG. 4 is a block diagram of a temperature control system in the static magnetic field generating section shown in FIG. 2.

FIG. 4 shows a block diagram of the temperature controller associated with the static magnetic field generating section 2. As shown, the temperature controller comprises two temperature control circuits 172 and 174. The temperature control circuits 172 and 174 are comprised of microprocessors, for example. The temperature control circuit 172 is supplied with a detected temperature signal t1 from the temperature sensor 154, and the temperature control circuit 174 is supplied with a detected temperature signal t2 from the temperature sensor 158. In addition, the temperature control circuits 172 and 174 are given a common preset temperature value Ts. It should be noted that the temperature control circuit 172 and 174 may have individual preset temperature values Ts.

The temperature control circuit 172 performs a calculation, such as a PID operation, for calculating a control output with respect to the deviation of the detected temperature signal t1 from the preset temperature value Ts. The temperature control circuit 174 performs a calculation, such as a PID operation, for calculating a control output with respect to the deviation of the detected temperature signal t2 from the preset temperature value Ts.

The heat elements 132 and 134 of the electric heater 122 are supplied with respective electric powers from a commercial alternating power source 176 via switches 182 and 184. For the switches 182 and 184, semiconductor switches are employed. It should be noted that although the heat elements 132 and 134 are distributed over four positions on the horizontal yoke 102 as described above, they are shown together at one position in FIG. 4 for convenience of illustration. Since the power supply to the heat elements 132 and 134 is achieved using the commercial alternating power source, the power source circuit can be simplified.

The heat elements 142 and 144 of the electric heater 124 are supplied with respective electric powers from the commercial alternating power source 176 via switches 192 and 194. Again, the heat elements 142 and 144 distributed over four positions on the horizontal yoke 104 as described above are shown together at one position in FIG. 4 for convenience. Since the power supply to the heat elements 142 and 144 is achieved using the commercial alternating power source, the power source circuit can be simplified.

The duty ratios between ON and OFF of the switches 182 and 184 are individually controlled by two output signals from the temperature control circuit 172, and respective average heat release amounts of the heat elements 132 and 134 are controlled so that the temperature of the lower portion of the static magnetic field generating section 2 is equalized to the preset temperature value Ts. A portion consisting of the temperature control circuit 172 and the switches 182 and 184 represents an embodiment of the temperature regulating means of the present invention.

Similarly, the duty ratios between ON and OFF of the switches 192 and 194 are individually controlled by two output signals from the temperature control circuit 174, and respective average heat release amounts of the heat elements 142 and 144 are controlled so that the temperature of the upper portion of the static magnetic field generating section 2 is equalized to the preset temperature value Ts. A portion consisting of the temperature control circuit 174 and the switches 192 and 194 represents an embodiment of the temperature regulating means of the present invention.

Thus, by individually controlling the lower and upper portions of the static magnetic field generating section 2 by the two temperature control systems, the temperature difference can be eliminated between the upper and lower permanent magnets even when the temperature difference is large between the upper and lower portions in the environment in which the static magnetic field generating section 2 is installed. Thus, the static magnetic field can be stabilized regardless of the temperature distribution in the vertical direction in the installation environment.

Since the heat quantity applied to the controlled objects is generated by two heat elements, their on-off patterns can be separately regulated, and more various heat release pattern can be generated, as compared to the case of a single heat element, in combination with the difference between their respective rated heat release amounts, thereby facilitating suitable temperature control.

Figures 3, 5:
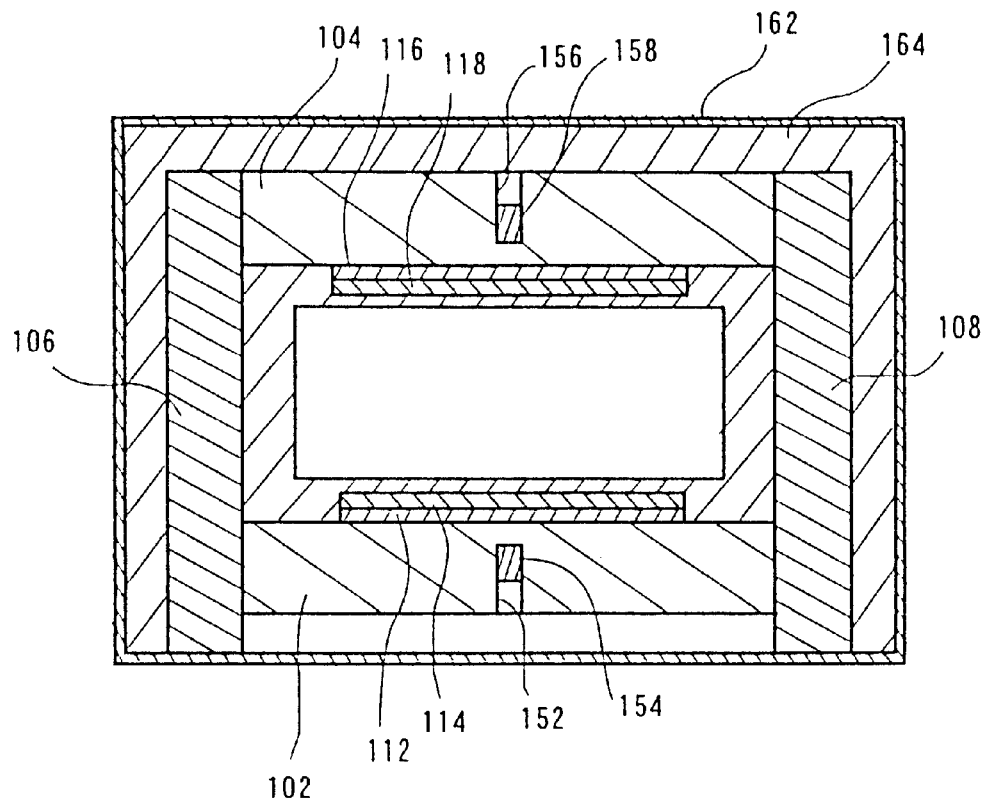
FIG. 3 schematically illustrates configuration of the static magnetic field generating section in the apparatus shown in FIG. 1.
FIG. 5 shows heat release patterns of heat elements shown in FIG. 4.

Typical heat release patterns are shown in FIG. 5. In FIG. 5, Pattern 1 is such that both the two heat elements A and B are continuously ON. This generates the largest heat quantity. Pattern 2 is such that the heat element A having a larger heat release amount is continuously ON and the heat element B having a smaller heat release amount is continuously OFF. Pattern 2 generates a smaller heat quantity than Pattern 1 does. Pattern 3 is such that the heat element A having the larger heat release amount is continuously OFF and the heat element B having the smaller heat release amount is continuously ON. Pattern 3 generates a smaller heat quantity than Pattern 2 does.

Pattern 4 is such that the heat element A is turned ON and OFF by PWM and the heat element B is continuously ON. Pattern 4 generates a larger heat quantity than Pattern 3 does by a value corresponding to the PWM of A. Pattern 5 is such that the heat element A is turned ON and OFF by PWM and the heat element B is continuously OFF. Pattern 5 generates a smaller heat quantity than Pattern 4 does by a value corresponding to the heat element B turned OFF.

Pattern 6 is such that the heat element A is continuously ON and the heat element B is turned ON and OFF by PWM. This pattern generates a larger heat quantity than Pattern 2 does by a value corresponding to the PWM of B. Pattern 7 is such that the heat element A is continuously OFF and the heat element B is turned ON and OFF by PWM. This pattern generates a smaller heat quantity than Pattern 6 does by a value corresponding to the heat element A turned OFF. Pattern 8 is such that both the two heat elements A and B are turned ON and OFF by PWM. Pattern 8 can generate a heat having the widest variable range by separately regulating the PWM of these heat elements.

By appropriately using such heat release patterns, the temperature control can be performed with the most suitable heat release pattern according to the condition of the controlled objects. More specifically, for example, if the static magnetic field generating section 2 is to be quickly heated when the temperature deviation is large, the static magnetic field generating section 2 is heated by the largest heat quantity; and if the temperature control is to be performed when the temperature deviation is small, i.e., in the low-ripple state, such as when regular control is performed during operation of the magnetic resonance imaging apparatus, a heat element having a smaller heat release amount is turned ON and OFF by PWM, for example, to maintain a constant temperature.

This can reduce frequency of switching between ON and OFF of the heat elements in the low-ripple state, and can increase stability of the control. Moreover, the decrease in frequency of switching between ON and OFF reduces noises etc. and contributes to improvement of the quality of a captured image. Furthermore, it is possible to stop turning the heat elements ON or OFF during a scan, thereby providing an image having a still higher quality.

If an external turbulence such as a steep change in the ambient temperature suddenly alters the temperature deviation, a heat release pattern that leads to the most suitable recovery action can be selected according to the degree of the turbulence. Therefore, the stability of control can be maintained even when an abrupt external turbulence occurs.

While the preceding description refers to the case of removing the effect of the temperature difference in the vertical direction in the installation environment, if the installation environment has a temperature difference in the horizontal direction, the temperature control similar to above may be performed for a plurality of positions in the right-and-left direction or in the front-and-back direction of the static magnetic field generating section 2.

Since a permanent magnet loses its magnetism at a high temperature, if the temperature increases extraordinarily caused by a crash of the control due to a failure in the temperature control circuits 172 and 174 etc., the static magnetic field generating section 2 will not generate a static magnetic field. To prevent such a trouble, the temperature control circuits 172 and 174 are provided with a shutdown function for anomaly. However, if a temperature lower than an actual temperature is input due to a sensitivity degradation in the temperature sensor 154 or 156, for example, the permanent magnets would be exposed to an excessive temperature even if the temperature control circuits 172 and 174 should normally operate.

Figure 6:
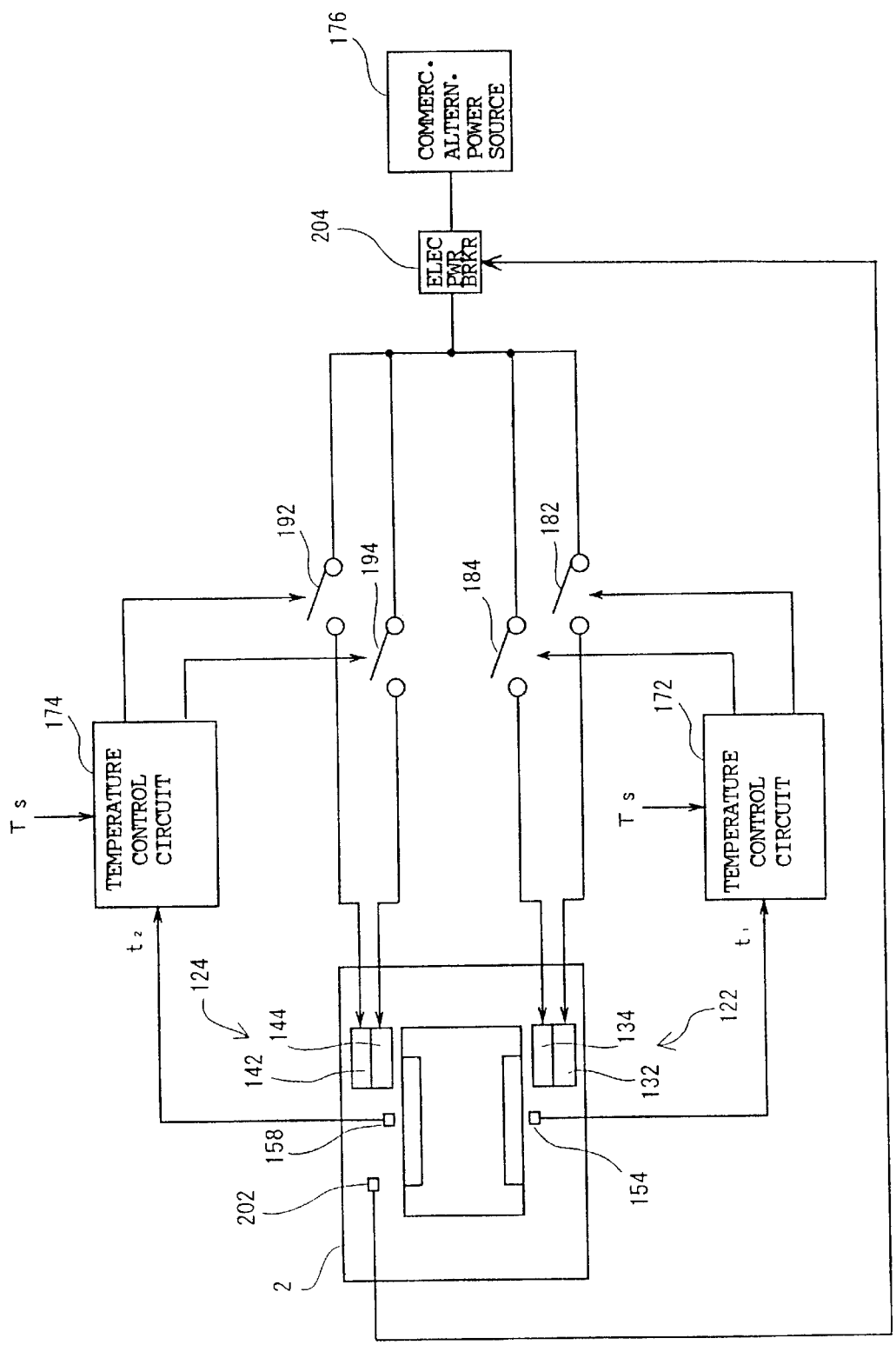
FIG. 6 is another block diagram of the temperature control system in the static magnetic field generating section shown in FIG. 2.

Then, means is provided for detecting the temperature separately from the temperature sensors 154 and 158 and forcibly cutting off the power supply to the heat elements when the extraordinarily high temperature is detected. FIG. 6 shows a block diagram of the static magnetic field generating section 2 comprising such means. In FIG. 6, parts similar to those shown in FIG. 4 are designated by the same reference numerals and explanation thereof will be omitted.

As shown in FIG. 6, the static magnetic field generating section 2 is fitted with a temperature upper limit sensor 202 at an appropriate position. The temperature upper limit sensor 202 represents an embodiment of the temperature excess detecting means of the present invention. Preferably, a thermostat is employed as the temperature upper limit sensor 202 in that a thermostat has a simple structure and operates reliably. The fitting position is desirably as close to the permanent magnet as possible. The number of the temperature upper limit sensor 202 is not limited to one, and a plurality of the temperature upper limit sensors 202 may be attached respectively to a plurality of positions.

A temperature signal detected by the temperature upper limit sensor 202 is input to an electric power breaker 204 disposed on a power supply line from the commercial alternating power source 176. The electric power breaker 204 represents an embodiment of the temperature lowering means of the present invention. Preferably, a power relay is employed as the electric power breaker 204 in that a power relay has a simple structure and operates reliably. Alternatively, a semiconductor element may be employed having an equivalent function to that of the power relay 204.

Figure 7:
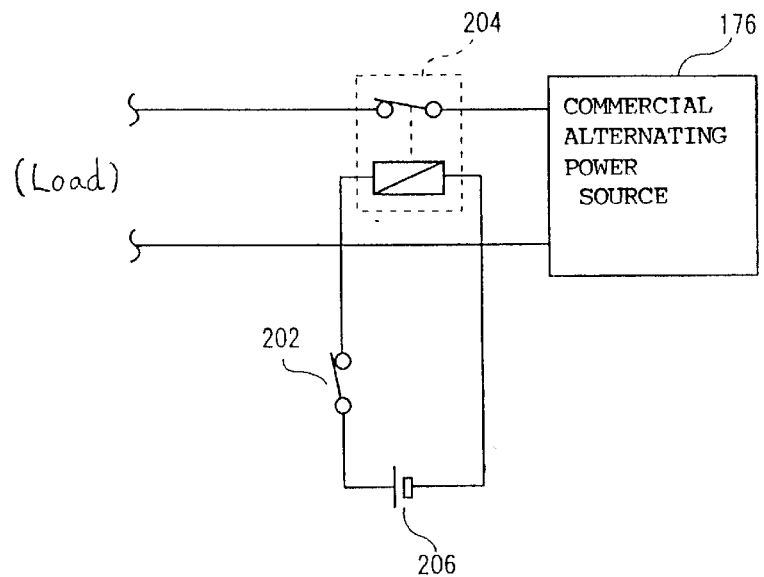
FIG. 7 is an electric circuit diagram illustrating a connection relationship between a temperature upper limit sensor and an electric power breaker.

An exemplary power supply cut-off circuit employing a thermostat and a power relay is shown in FIG. 7. As shown, while an upper limit temperature is not exceeded, the power relay 204 is kept in the ON state by a magnetizing current supplied from a power source 206 via a closed contact point of the thermostat 202, and an electric power is supplied from the commercial alternating power source 202 to a load. When the temperature exceeds the upper limit, the contact point of the thermostat 202 is opened and the magnetizing current is lost, and a contact point of the power relay 204 is opened, thereby cutting off the power supply to the load.

When a plurality of thermostats 202 are employed and disposed on a plurality of positions in the static magnetic field generating section 2, all of the thermostats 202 can be connected in series to cut off the power supply if the temperature exceeds the upper limit at any position. It should be noted that a temperature fuse may be used instead of the thermostat.

Figure 8:
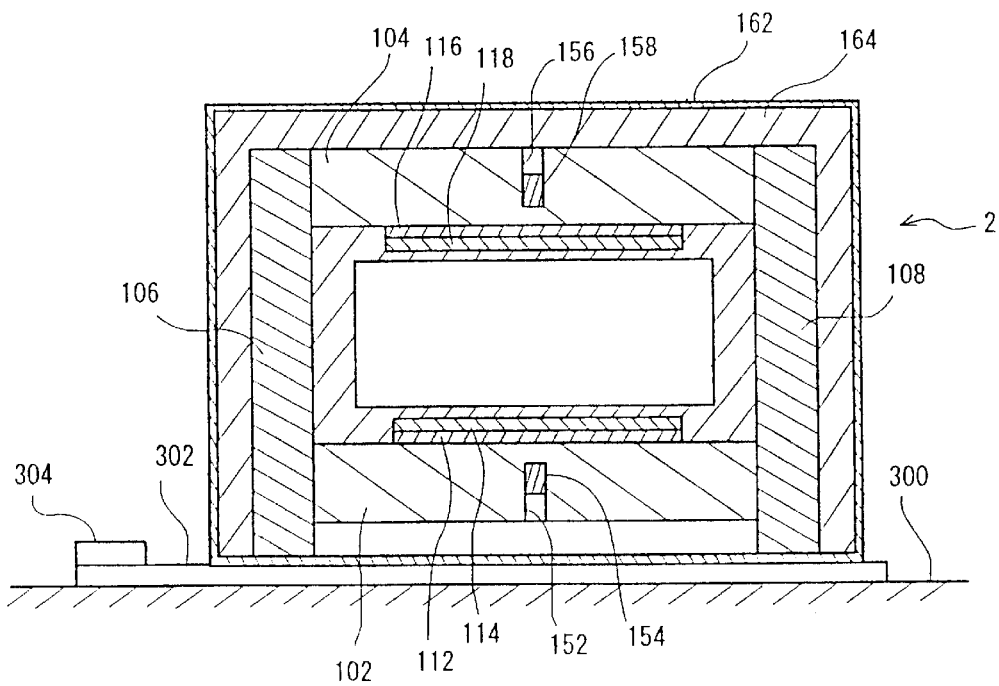
FIG. 8 schematically illustrates configuration of the static magnetic field generating section in the apparatus shown in FIG. 1.

In order to reduce the temperature difference between the upper and lower portions in the installation environment for the static magnetic field generating section 2, a temperature-regulated heat releasing mat may be laid on a floor surface on which the static magnetic field generating section 2 is placed, as exemplarily shown in FIG. 8. As shown, the heat releasing mat 302 is laid between the floor surface 300 and the static magnetic field generating section 2, and the temperature of the mat 302 is regulated by a temperature controller 304. This allows stable operation of the static magnetic field generating section of, for example, a mobile magnetic resonance imaging apparatus in the hard winter etc. The heat releasing mat 302 represents an embodiment of the temperature stabilizing means of the present invention. It should be noted that when the static magnetic field generating section is attached to a wall or a ceiling instead of on the floor the heat releasing mat 302 is disposed between such an attaching surface and the static magnetic field generating section.

While the preceding description is made with reference to a case in which the temperature of the static magnetic field generating section 2 is kept higher than the ambient temperature, it will be easily recognized that the temperature of the static magnetic field generating section 2 is not necessarily kept higher than the ambient temperature, but may be kept lower than the ambient temperature. In this case, a system that generates a negative heat quantity, i.e., a cooler is employed as means for applying a heat quantity to the static magnetic field generating section 2. The cooler also represents an embodiment of the heat generating means of the present invention. By applying the temperature control as described above to the cooler, the same effect as above can be obtained. However, when an extraordinary temperature increase is detected by the thermostat, an emergency cooler should be activated instead of cutting off the heat generating means (i.e., the cooler).

Now the operation of the present apparatus will be described. The subject 8 is placed on the imaging table 10 and the receive coil section 120 is attached to the imaging table 10. Then, the imaging table 10 is carried into the internal space of the static magnetic field generating section 2 and imaging is started. The imaging is carried out under the control of the control section 30. The following explanation refers to imaging by a spin-echo technique as a particular example of the magnetic resonance imaging. The spin-echo technique employs a pulse sequence as exemplarily shown in FIGS. 9(A)–9(F).

FIGS. 9(A)–9(F) together are a schematic diagram of a pulse sequence for acquiring a magnetic resonance signal (spin-echo signal) for one view. Such a pulse sequence is repeated 256 times, for example, to acquire spin-echo signals for 256 views.

The execution of the pulse sequence and the acquisition of the spin-echo signals are controlled by the control section 30. It will be easily recognized that the magnetic resonance imaging is not limited to being performed using the spin-echo technique but other several techniques such as a gradient-echo technique may be employed.

As shown in FIG. 9(F), the pulse sequence is divided into four periods (a)–(d) along the time axis. First, RF excitation is achieved by a 90° pulse P90 in the period (a) as shown in FIG. 9(A). The RF excitation is performed by the transmit coil sections 6 and 6' driven by the transmitter section 18.

Along with the RF excitation, a slice gradient magnetic field Gs is applied as shown in FIG. 9(B). The application of the slice gradient magnetic field Gs is performed by the gradient coil sections 4 and 4' driven by the gradient driving section 16. Spins in a predefined slice within the subject 8 are thus excited (selective excitation).

Next, a phase-encoding gradient magnetic field Gp is applied in a period (b) as shown in FIG. 9(C). The application of the phase-encoding gradient magnetic field Gp is also performed by the gradient coil sections 4 and 4' driven by the gradient driving section 16. The phase encoding of the spins is thus achieved.

Also in the phase-encoding period, rephasing of the spins is achieved by the slice gradient magnetic field Gs as shown in FIG. 9(B). In addition, a readout gradient magnetic field Gr is applied as shown in FIG. 9(D) to dephase the spins. Again, the application of the readout gradient magnetic field Gr is performed by the gradient coil sections 4 and 4' driven by the gradient driving section 16.

Then, a 180° pulse P180 is applied in a period (c) as shown in FIG. 9(A), causing the spins to be inverted. The inversion of the spins is achieved by the transmit coil sections 6 and 6' that are RF-driven by the transmitter section 18.

Next, the readout gradient magnetic field Gr is applied in a period (d) as shown in FIG. 9(D). A spin-echo signal MR is thus generated from the subject 8 as shown in FIG. (E). The spin-echo signal MR is received by the receive coil sections 120.

The received signal is input to the computer 24 via the receiver section 20 and the A-D converter section 22. The computer 24 stores the input signal into a memory as measured data, Thus, spin-echo data for one view is collected in the memory.

The above operation is repeated 256 times, for example, in a predetermined cycle. The phase-encoding gradient magnetic field Gp is varied for each repetition, resulting in different phase encoding each time. This is indicated by a plurality of broken lines at the waveform in FIG. 9(C).

The computer 24 performs image reconstruction based on the spin-echo data for all views collected in the memory, and produces an image. Because the static magnetic field generating section 2 is temperature-controlled as described above, the generated static magnetic field has good stability and generation of noises associated with the temperature control can be reduced, thereby providing an image produced with a high quality.

Many widely different embodiments of the invention may be configured without departing from the spirit and the scope of the present invention. It should be understood that the present invention is not limited to the specific embodiments described in the specification, except as defined in the appended claims.

What is claimed is:

1. A magnetic field stabilization method of stabilizing a magnetic field generating apparatus having a pair of permanent magnets facing each other with a space interposed and a plurality of yokes constituting a magnetic circuit for said pair of permanent magnets, comprising the steps of detecting a plurality of separate temperatures of a plurality of positions in said plurality of yokes; and controlling respective plurality of heat quantities to be applied to said plurality of positions based on said detected plurality of separate temperatures at said plurality of positions to stabilize the respective temperatures of said plurality of positions.

2. The magnetic field stabilization method as recited in claim 1, wherein said heat quantities are obtained by electric heaters.

3. A magnetic field generating apparatus comprising:

a pair of permanent magnets facing each other with a space interposed;

a plurality of yokes constituting a magnetic circuit for said pair of permanent magnets;

a plurality of temperature detecting means for detecting a plurality of separate temperatures of a plurality of positions in said plurality of yokes;

a plurality of heat generating means for generating respective heat quantities to be applied to said plurality of positions; and a plurality of temperature regulating means for controlling said plurality of heat generating means, respectively, based on the detected plurality of separate temperatures of said plurality of positions to stabilize the respective separate temperatures at said plurality of positions.

4. The apparatus of claim 3 used in a magnetic imaging apparatus as a static magnetic field generating means for generating a static magnetic field within a space containing a subject; and further comprising gradient magnetic field generating means for generating gradient magnetic fields in said space;

high frequency magnetic field generating means for generating a high frequency magnetic field in said space;

measuring means for measuring magnetic resonance signals from said space; and image producing means for producing an image based on the magnetic resonance signals measured by said measuring means.

5. The magnetic field generating apparatus as recited in claim 3, wherein said heat quantities are obtained by electric heaters.

6. The magnetic field generating apparatus as recited in claim 3, comprising:

temperature stabilizing means for stabilizing the temperature of a portion contacting with an installation surface.

7. The magnetic field generating apparatus as recited in claim 6 or 5, wherein said plurality of heat generating means generate the heat quantities based on an alternating electric power having a commercial frequency.

8. The magnetic field generating apparatus as recited in claim 3 or 6, comprising:

temperature excess detecting means for detecting a temperature of said yokes exceeding a predetermined limit; and temperature lowering means for lowering the temperature of said yokes based on an output signal from said temperature excess detecting means.

* * * * *